United States Patent
Sun

(10) Patent No.: US 9,809,491 B2
(45) Date of Patent: Nov. 7, 2017

(54) DEVICE AND METHOD FOR BAKING SUBSTRATE

(71) Applicant: Shenzhen China Star Optoelectronics Technology Co., Ltd, Shenzhen, Guangdong (CN)

(72) Inventor: Shih Ying Sun, Shenzhen (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 601 days.

(21) Appl. No.: 14/240,331

(22) PCT Filed: Jan. 21, 2014

(86) PCT No.: PCT/CN2014/071028
§ 371 (c)(1),
(2) Date: Feb. 21, 2014

(87) PCT Pub. No.: WO2015/032181
PCT Pub. Date: Mar. 12, 2015

(65) Prior Publication Data
US 2015/0071622 A1    Mar. 12, 2015

(30) Foreign Application Priority Data
Sep. 9, 2013   (CN) .......................... 2013 1 0408421

(51) Int. Cl.
C03C 17/32   (2006.01)
F27B 17/00   (2006.01)
(Continued)

(52) U.S. Cl.
CPC .......... *C03C 17/32* (2013.01); *F27B 17/0025* (2013.01); *F27D 3/0084* (2013.01); *H01L 21/67109* (2013.01); *H01L 21/68742* (2013.01)

(58) Field of Classification Search
CPC combination set(s) only.
See application file for complete search history.

(56) References Cited

U.S. PATENT DOCUMENTS 5,796,066 A * 8/1998 Guyot .................. B23K 37/047
118/728
5,817,156 A * 10/1998 Tateyama .......... H01L 21/67109
118/725
(Continued)

FOREIGN PATENT DOCUMENTS

CN          1743964 A      3/2006
CN        101807538 A      8/2010
(Continued)

OTHER PUBLICATIONS

International Search Report dated Jun. 11, 2014, issued to the corresponding International Application No. PCT/CN2014/071028.

*Primary Examiner* — Dana Ross
*Assistant Examiner* — Renee Larose
(74) *Attorney, Agent, or Firm* — Kim Winston LLP

(57) ABSTRACT

The present disclosure relates to a device and a method for baking a substrate. The device includes a hot plate, and a supporting member for supporting a substrate to be processed, wherein the supporting member is located between the hot plate and the substrate to be processed, and can move relative to the hot plate so as to adjust the contacting position of the supporting member with the substrate to be processed. With the device, the yield of the substrate can be increased.

7 Claims, 3 Drawing Sheets

(51) Int. Cl.
*F27D 3/00* (2006.01)
*H01L 21/67* (2006.01)
*H01L 21/687* (2006.01)

(56) References Cited

U.S. PATENT DOCUMENTS

| | | | | |
|---|---|---|---|---|
| 5,885,423 A * | 3/1999 | Guyot | ............... | H01L 21/6831 118/715 |
| 5,911,896 A * | 6/1999 | Holden | ............ | H01L 21/67109 118/725 |
| 6,104,002 A * | 8/2000 | Hirose | ............... | C03C 17/001 118/729 |
| 6,231,716 B1 * | 5/2001 | White | ............... | H01L 21/67748 118/500 |
| 6,829,022 B2 * | 12/2004 | Kim | ............... | G02F 1/1333 118/500 |
| 6,929,774 B2 * | 8/2005 | Morad | ............ | H01L 21/67109 266/81 |
| 6,935,466 B2 * | 8/2005 | Lubomirsky | ..... | H01L 21/68742 118/724 |
| 7,244,311 B2 * | 7/2007 | Fischer | ............... | C03C 15/00 118/725 |
| 7,273,403 B2 * | 9/2007 | Yokota | ............... | G02F 1/1333 349/187 |
| 8,148,665 B2 * | 4/2012 | Lim | ............... | H01L 21/67109 118/728 |
| 2005/0022742 A1 * | 2/2005 | Hong | ............... | H01L 21/67103 118/725 |
| 2005/0028740 A1 * | 2/2005 | Okuda | ............... | H01L 21/6838 118/728 |
| 2006/0005770 A1 * | 1/2006 | Tiner | ............... | H01L 21/68742 118/728 |
| 2006/0054791 A1 * | 3/2006 | Lim | ............... | H01L 21/67109 250/216 |
| 2007/0028842 A1 * | 2/2007 | Inagawa | ............ | H01J 37/32458 118/728 |
| 2013/0137335 A1 * | 5/2013 | Yin | ............... | G02F 1/1333 445/60 |
| 2013/0279889 A1 * | 10/2013 | Zhu | ............... | G02F 1/13378 392/382 |
| 2014/0178056 A1 * | 6/2014 | Zhu | ............... | C03C 17/002 392/411 |
| 2015/0093100 A1 * | 4/2015 | Ranish | ............ | H01L 21/67248 392/418 |
| 2015/0163860 A1 * | 6/2015 | Burkhart | ............ | H05B 3/0047 219/444.1 |

FOREIGN PATENT DOCUMENTS

CN 202111064 U 1/2012
WO WO 2012/141082 A1 10/2012

* cited by examiner

--Prior Art--

-Prior Art--

DEVICE AND METHOD FOR BAKING SUBSTRATE

FIELD OF THE INVENTION

The present disclosure relates to the technical field of liquid crystal displays, and specifically, relates to a device and a method for baking a glass substrate of a liquid crystal display, which are particularly suitable for solving the problem that the glass substrate cannot be heated uniformly in a high temperature furnace.

BACKGROUND OF THE INVENTION

In the manufacturing process of a liquid crystal substrate, it is necessary to prebake polyimide (PI) liquid on a glass substrate. In the baking process, generally the glass substrate is irradiated by infrared rays and heated to a certain temperature, so that solvent in the PI liquid is evaporated, with a result that the concentration of PI is increased. In the above-mentioned baking process, the glass substrate is generally supported by lift pins or supporting pins. However, the material for the lift pins or supporting pins is not absolutely thermally-insulated, and thus difference of heat conduction rates exists between areas where the glass substrate is in contact with the lift pins or the supporting pins and non-contacting areas (i.e., areas where the glass substrate is not in contact with the lift pins or the supporting pins). Therefore, the glass substrate cannot be heated uniformly, causing mura defects appear on the glass substrate. Consequently, the yield of acceptable glass substrates is reduced.

FIG. 4 to FIG. 6 show a device for baking a substrate in the prior art. With reference to FIG. 4 and FIG. 5, the device for baking the glass substrate in the prior art includes a hot plate 1' and a plurality of lift pins 2'. Holes through which the lift pins 2' can pass are formed in the hot plate 1'. The lift pins 2' extend through the hot plate 1' via the holes and then support a glass substrate 3' to be heated. The prior art has the following defects. With reference to FIG. 6, hot air is sprayed to the back side of display areas (chip AA areas) 3.1' through the holes for the lift pins during heating, so that temperature difference or non-uniform heating exists between the display areas corresponding to the holes (elliptical areas in the glass substrate 3') and the remaining areas. Therefore, as shown in FIG. 5, mura defects corresponding to the supporting positions of the lift pins 2' on the glass substrate 3' appear in the display areas 3.1' of the glass substrate 3'. Consequently, the quality and yield of the glass substrate are affected.

SUMMARY OF THE INVENTION

One technical problem to be solved in the present disclosure is to provide a device for baking a glass substrate, which can enable the substrate to be heated in a more uniform manner so as to improve the yield of the substrate.

The technical solution provided by the present disclosure is to propose a device for baking a glass substrate with the following structure. The device includes a hot plate, and a supporting member for supporting a substrate to be processed, wherein the supporting member is located between the hot plate and the substrate to be processed, and can be moved relative to the hot plate so as to adjust the contacting position of the supporting member with the substrate to be processed.

Compared with the prior art, the device for baking the substrate in the present disclosure has the following advantages. Because the supporting member for supporting the substrate to be processed (such as a glass substrate to be heated) according to the present disclosure can move relative to the hot plate, the contacting position between the supporting member and the substrate to be processed can be adjusted according to the specific structure of the substrate to be processed or a workpiece to be heated (such as the glass substrate). In particular, the supporting member can be adjusted to non-display areas of the substrate to be processed, such as edge areas of the substrate to be processed and/or spacer areas between display areas of the substrate to be processed, so as to avoid damages of the workpiece and a condition of non-uniform heating due to abutment of the supporting member against the display areas. In this manner, the non-uniform heating condition of the display areas of the substrate to be processed as occurs in the prior art can be prevented, and mura defects can be reduced or avoided accordingly. Moreover, because no holes through which the lift pins can pass are necessary to be formed in the hot plate, the substrate can be heated in a more uniform manner. Therefore, pin mura can be avoided, and the objective of improving the yield of the substrate can be achieved.

As an improvement on the device for baking the substrate in the present disclosure, the supporting member includes a plurality of elongated strip-like bases, and on the side of each elongated strip-like base facing the hot plate there is provided with a plurality of lift pins, which are arranged at intervals and configured to support the substrate to be processed. The plurality of elongated strip-like bases can move along the horizontal direction and the vertical direction relative to the substrate to be processed (such as the glass substrate), so that optimal contacting positions between the lift pins and the substrate to be processed (such as the glass substrate) can be found.

As a preferred arrangement of the device for baking the substrate in the present disclosure, the width of the elongated strip-like base is not greater than that of a spacer area between two adjacent rows of display areas partitioned from the substrate. In this manner, the elongated strip-like bases will not hinder the hot plate to heat the display areas of the substrate to be processed (such as the glass substrate), so that the substrate to be processed (such as the glass substrate) can be heated in a more uniform manner.

As another preferred arrangement of the device for baking the substrate in the present disclosure, the elongated strip-like base is longer than the substrate to be processed. With this structure, the elongated strip-like bases can be moved in a convenient way.

As a further improvement on the device for baking the substrate in the present disclosure, the supporting member includes a base formed by one single plate, and on the side of the base facing the hot plate there are provided with a plurality of lift pins, which are arranged at intervals and configured to support the substrate to be processed. The base formed by one single plate as a whole is relatively convenient to move, so that optimal contacting positions between the lift pins and the substrate to be processed (such as the glass substrate) can be easily found by moving the base.

As a still further preferred arrangement of the device for baking the substrate in the present disclosure, the length and width of the base are not smaller than those of the hot plate respectively. When the length and width of the base are not smaller than those of the hot plate, since the base formed by one single plate is located between the hot plate and the substrate to be processed (such as the glass substrate), the base will influence on the substrate to be processed (such as the glass substrate) in a uniform manner, thus avoiding the condition that the substrate to be processed (such as the glass substrate) is not heated uniformly.

Another technical problem to be solved in the present disclosure is to provide a method for baking a glass substrate, which can enable the substrate to be heated more uniformly.

Starting from the technical problem, the technical solution of the present disclosure is to provide a method for baking a substrate with the above device for baking the substrate in the present disclosure, including the following steps:

placing the supporting member in a baking oven for baking the substrate to be processed, and supporting the supporting member at two ends thereof by corresponding supporting mechanisms located at two sides of the baking oven;

fixing the substrate to be processed in the baking oven;

moving the supporting member so that the supporting member is located within non-display areas of the substrate to be processed; and heating the substrate to be processed with a hot plate.

According to the method, the supporting member can be moved and then support the non-display areas of the substrate to be processed. Therefore, the condition that display areas of the substrate to be processed (such as the glass substrate) cannot be heated uniformly since they are supported by the supporting member during heating can be avoided. Therefore, the heating condition of the display areas is improved. Consequently, the substrate to be processed (such as the glass substrate), particularly the display areas thereof, can be heated in a more uniform manner.

As a preferred option of the method for baking the substrate in the present disclosure, the non-display areas indicate areas of the substrate to be processed except the display areas.

As another preferred option of the method for baking the substrate in the present disclosure, the non-display areas include spacer areas and/or edge areas. The non-display areas can be used as optimal contacting positions between the lift pins and the substrate to be processed, which can be selected based on different shapes of the substrates to be processed (such as glass substrates).

As a further preferred option of the method for baking the substrate in the present disclosure, the temperature in the baking oven can be selected as from 120° C. to 240° C. The heating temperature can be appropriately selected according to different materials or different attributes of substrates to be processed (such as the glass substrates).

LIST OF REFERENCE SIGNS

Figure 1:
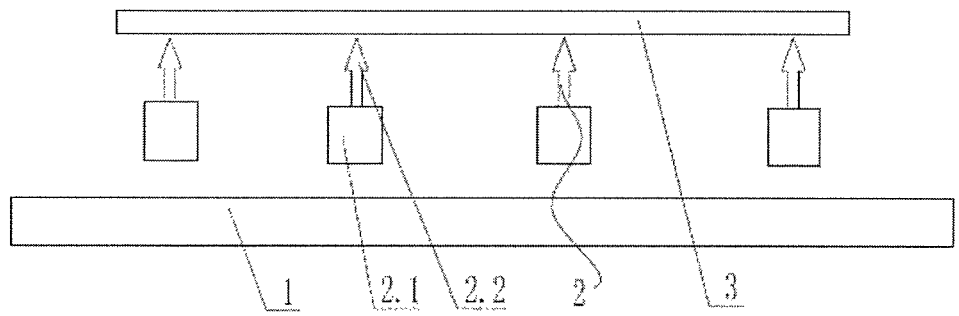
FIG. 1 schematically shows the structure of a device for baking a substrate according to the present disclosure.
Figure 2:
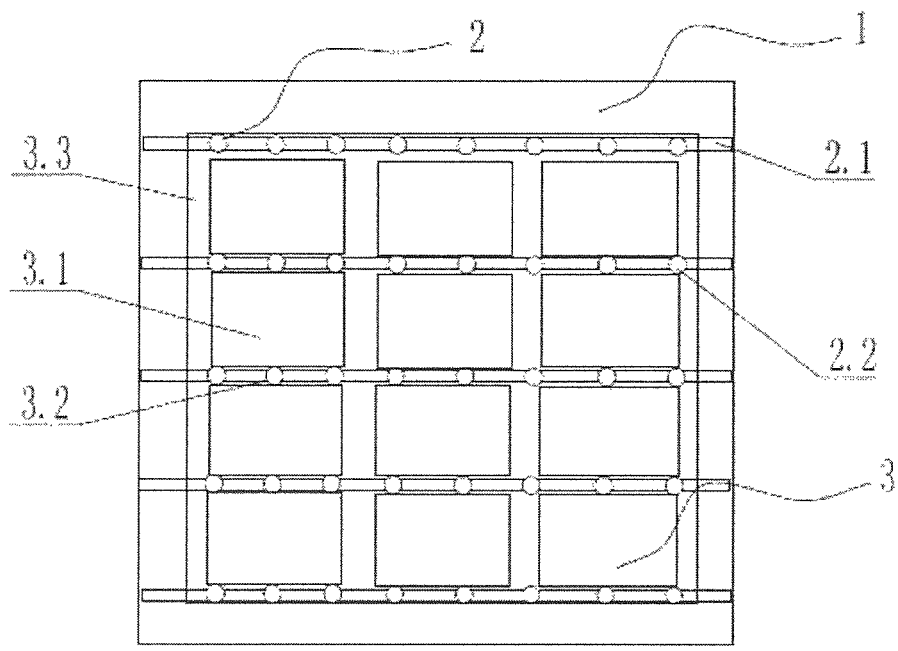
FIG. 2 schematically shows a top view of the structure of an embodiment according to FIG. 1.
Figure 3:
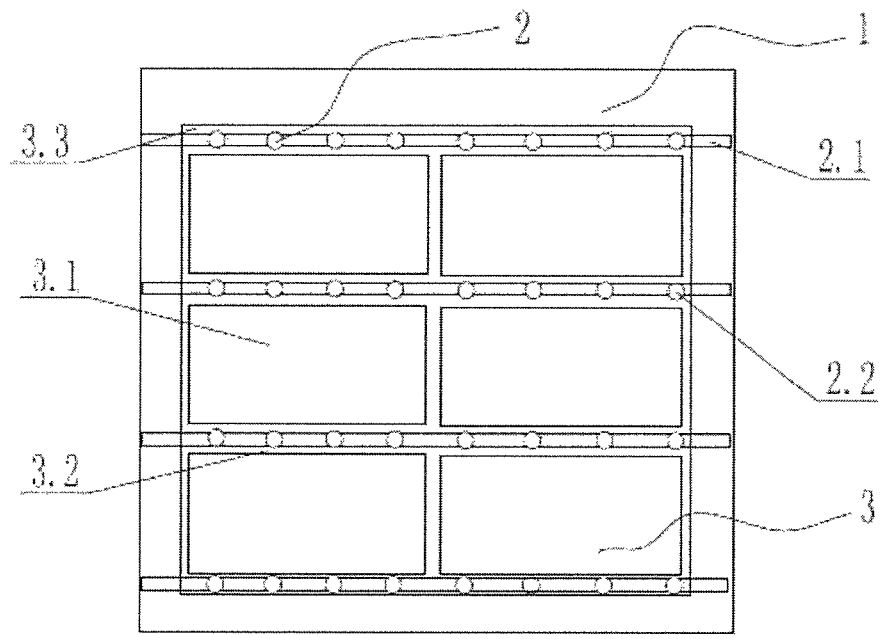
FIG. 3 schematically shows a top view of the structure of another embodiment according to FIG. 1.
Figure 4:
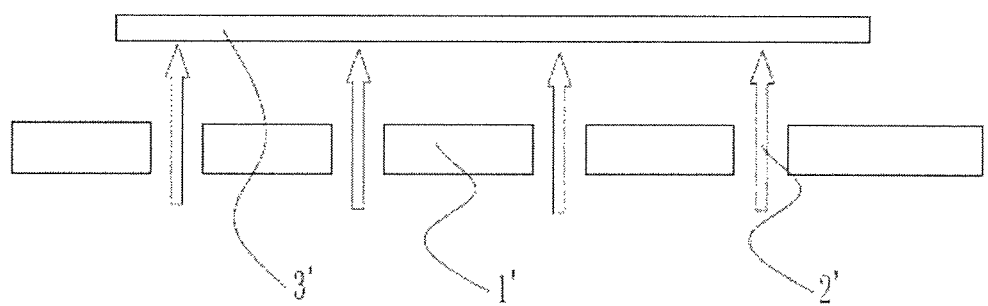
FIG. 4 schematically shows the structure of a device for baking a substrate in the prior art.
Figure 5:
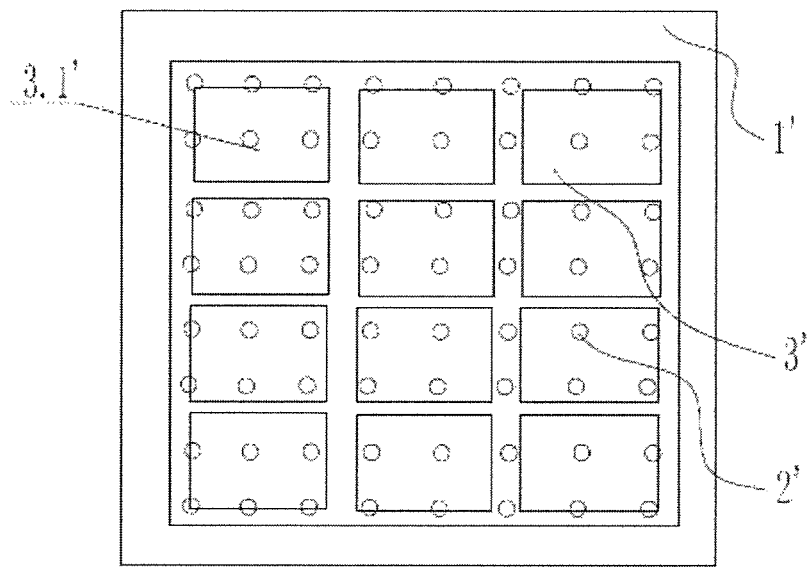
FIG. 5 schematically shows a top view of the device of an embodiment according to FIG. 4.
Figure 6:
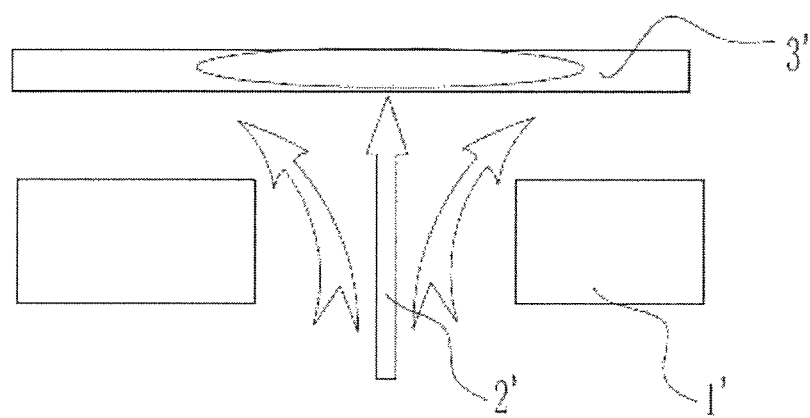
FIG. 6 schematically shows the heating condition of a glass substrate in FIG. 4.

In FIG. 1 to FIG. 3: 1—hot plate, 2—supporting member, 2.1—base, 2.2—lift pin, 3—substrate to be treated, 3.1—display area, 3.2—spacer area, and 3.3—edge area; and In FIG. 4 to FIG. 6: 1'—hot plate, 2'—lift pin, 3'—glass substrate, and 3.1'—display area.

DETAILED DESCRIPTION OF THE EMBODIMENTS

The present disclosure will be further illustrated below in conjunction with the accompanying drawings and specific embodiments.

FIG. 1 shows a structural schematic view of a device for baking a substrate according to the present disclosure. The device includes a hot plate 1 and a supporting member 2 for supporting a substrate 3 to be processed, wherein the supporting member 2 is located between the hot plate 1 and the substrate 3, and can be moved relative to the hot plate 1 so as to adjust the contacting positions thereof with the substrate 3.

In some specific embodiments of the present disclosure, the substrate 3 to be processed can be a glass substrate, but not limited to the glass substrate in the present disclosure. The substrate 3 can include all type of substrates available for liquid crystal displays.

FIG. 2 and FIG. 3 show two specific embodiments according to the present disclosure, respectively.

As shown in FIG. 2, the glass substrate to be heated is divided into 12 display areas 3.1, which are distributed in four rows and two columns. The supporting member 2 includes five elongated strip-like bases 2.1 capable of moving horizontally and vertically. On the side of each elongated strip-like base 2.1 facing the hot plate 1, there are provided with a plurality of lift pins 2.2, which are arranged at intervals and configured to support the substrate 3 to be processed. In this arrangement, two elongated strip-like bases 2.1 with the lift pins 2.2 are located in edge areas 3.3 at the front and rear sides of the glass substrate, and the other three strip bases 2.1 with the lift pins 2.2 abut against spacer areas 3.2 between adjacent rows of display areas 3.1.

As shown in FIG. 3, the glass substrate is divided into 6 display areas 3.1, which are distributed in three rows and two columns. The movable supporting member 2 includes four elongated strip-like bases 2.1, on each of which a plurality of lift pins 2.2 are arranged. The lift pins 2.2 abut against the edge areas 3.3 at the front and rear sides of the glass substrate, and also against the spacer areas 3.2 between adjacent rows of display areas 3.1, respectively.

Preferably, the width of the elongated strip-like base 2.1 is not greater than the width of the spacer areas 3.2 between two adjacent rows of display areas 3.1 partitioned from the substrate 3 to be processed. That is to say, as shown in FIG. 2 and FIG. 3, the width of the base 2.1 is preferably smaller than the width of the spacer areas 3.2 between two adjacent rows of display areas 3.1. In FIG. 2 and FIG. 3, the term "width" indicates the dimensions measured along the vertical position shown in the drawings.

Preferably, the elongated strip-like bases 2.1 are longer than the substrate 3 to be processed.

In an embodiment not shown, the supporting member 2 includes a base 2.1 formed by one single plate as a whole. On the side of the base 2.1 facing the hot plate 1 there are provided with a plurality of lift pins 2.2, which are arranged at intervals and configured to support the substrate 3 to be processed.

Preferably, the length and width of the base 2.1 are not smaller than those of the hot plate 1 respectively.

The present disclosure further discloses a method for baking a substrate with the device for baking the substrate according to the present disclosure, including the following steps:

placing the supporting member 2 in a baking oven for baking the substrate 3 to be processed, and supporting the supporting member 2 at two ends thereof by corresponding supporting mechanisms located at two sides of the baking oven;

fixing the substrate 3 to be processed in the baking oven;

moving the supporting member 2 so that the supporting member 2 is located within non-display areas of the substrate 3 to be processed; and heating the substrate 3 to be processed with a hot plate.

The non-display areas indicate areas of the substrate 3 to be processed except the display areas 3.1. The non-display areas include spacer areas 3.2 and/or edge areas 3.3. The temperature in the baking oven can be selected as from 120° C. to 240° C.

Although the present disclosure has been described in conjunction with the preferred embodiments, it could be understood that various modifications or substitutes could be made to the present disclosure without departing from the scope of the present disclosure. Particularly, as long as structural conflicts do not exist, all features in all the embodiments may be combined together, and the formed combined features are still within the scope of the present disclosure. The present disclosure is not limited to the specific embodiments disclosed in the description, but includes all technical solutions falling into the scope of the claims.

The invention claimed is:

1. A device for baking a substrate, including:
a hot plate, and
a supporting member for supporting a substrate to be processed,
wherein the supporting member is located between the hot plate and the substrate to be processed, and movable relative to the hot plate so as to adjust the contacting position of the supporting member with the substrate to be processed, and
wherein the supporting member includes a plurality of elongated strip bases, and on the side of each elongated strip base facing away from the hot plate there is provided with a plurality of lift pins, which are arranged at intervals and configured to support the substrate to be processed.

2. The device for baking a substrate according to claim 1, wherein the width of the elongated strip base is not greater than that of a spacer area between two adjacent rows of display areas partitioned from the substrate to be processed.

3. The device for baking a substrate according to claim 2, wherein the elongated strip base is longer than the substrate to be processed.

4. A method for baking a substrate comprising a device for baking the substrate, which includes a hot plate, and a supporting member for supporting a substrate to be processed, wherein the supporting member is located between the hot plate and the substrate to be processed, and can be moved relative to the hot plate so as to adjust the contacting position of the supporting member with the substrate to be processed, and wherein the supporting member includes a plurality of elongated strip bases, and on the side of each elongated strip base facing away from the hot plate there is provided with a plurality of lift pins, which are arranged at intervals and configured to support the substrate to be processed, the method including the following steps:
placing the supporting member in a baking oven for baking the substrate to be processed, and supporting the supporting member at two ends thereof;
fixing the substrate to be processed in the baking oven;
moving the supporting member so that the supporting member is located within non-display areas of the substrate to be processed; and
heating the substrate to be processed with the hot plate.

5. The method for baking a substrate according to claim 4, wherein the non-display areas indicate areas of the substrate to be processed except display areas.

6. The method for baking a substrate according to claim 5, wherein the non-display areas include spacer areas and/or edge areas.

7. The method for baking a substrate according to claim 4, wherein the temperature in the baking oven can be selected as from 120° C. to 240° C.

* * * * *